United States Patent
Thorum

(10) Patent No.: US 10,957,530 B2
(45) Date of Patent: Mar. 23, 2021

(54) FREEZING A SACRIFICIAL MATERIAL IN FORMING A SEMICONDUCTOR

(71) Applicant: Micron Technology, Inc., Boise, ID (US)

(72) Inventor: Matthew S. Thorum, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/847,705

(22) Filed: Dec. 19, 2017

(65) Prior Publication Data

US 2019/0189427 A1   Jun. 20, 2019

(51) Int. Cl.

| | |
|---|---|
| *H01L 21/02* | (2006.01) |
| *H01L 21/67* | (2006.01) |
| *B08B 9/00* | (2006.01) |
| *B81C 1/00* | (2006.01) |
| *B08B 1/00* | (2006.01) |
| *B08B 3/08* | (2006.01) |

(52) U.S. Cl.
CPC .......... *H01L 21/02057* (2013.01); *B08B 9/00* (2013.01); *B81C 1/00793* (2013.01); *B81C 1/00825* (2013.01); *H01L 21/0206* (2013.01); *H01L 21/02063* (2013.01); *H01L 21/02334* (2013.01); *H01L 21/67028* (2013.01); *H01L 21/67034* (2013.01); *H01L 21/67248* (2013.01); *B08B 1/00* (2013.01); *B08B 3/08* (2013.01); *B81C 1/00849* (2013.01); *B81C 2201/0109* (2013.01)

(58) Field of Classification Search
None
See application file for complete search history.

(56) References Cited

U.S. PATENT DOCUMENTS

| | | | |
|---|---|---|---|
| 7,749,909 B2 | 7/2010 | Tomita et al. | |
| 8,617,993 B2 | 12/2013 | Yasseri et al. | |
| 9,653,307 B1 | 5/2017 | Imonigie et al. | |
| 2011/0139083 A1 | 6/2011 | Krone et al. | |
| 2011/0189858 A1 | 8/2011 | Yasseri et al. | |
| 2012/0094493 A1 | 4/2012 | Hizawa et al. | |

(Continued)

FOREIGN PATENT DOCUMENTS

| | | |
|---|---|---|
| JP | 2012-160682 A | 8/2012 |
| JP | 2013-042094 A | 2/2013 |

(Continued)

OTHER PUBLICATIONS

H.-W. Chen et al., ECS Transactions, vol. 58, pp. 205-211. (Year: 2013).*

(Continued)

*Primary Examiner* — Jiong-Ping Lu
(74) *Attorney, Agent, or Firm* — Brooks, Cameron & Huebsch, PLLC

(57) ABSTRACT

The present disclosure includes apparatuses and methods related to freezing a sacrificial material in forming a semiconductor. In an example, a method may include solidifying, via freezing, a sacrificial material in an opening of a structure, wherein the sacrificial material has a freezing point below a boiling point of a solvent used in a wet clean operation and removing the sacrificial material via sublimation by exposing the sacrificial material to a particular temperature range.

13 Claims, 5 Drawing Sheets

(56) References Cited

U.S. PATENT DOCUMENTS

| | | | | |
|---|---|---|---|---|
| 2012/0304483 A1* | 12/2012 | Sirard | ............... | H01L 21/02057 |
| | | | | 34/289 |
| 2013/0008868 A1 | 1/2013 | Uozumi et al. | | |
| 2013/0081301 A1 | 4/2013 | Gouk et al. | | |
| 2015/0064911 A1* | 3/2015 | Kaneko | ............... | H01L 21/6715 |
| | | | | 438/694 |
| 2015/0118821 A1* | 4/2015 | Millward | ............... | H01L 28/40 |
| | | | | 438/386 |
| 2015/0128991 A1 | 5/2015 | Brown et al. | | |
| 2016/0042945 A1 | 2/2016 | Limary et al. | | |
| 2017/0250094 A1 | 8/2017 | Verhaverbeke et al. | | |

FOREIGN PATENT DOCUMENTS

| | | | | |
|---|---|---|---|---|
| JP | 2013042094 | * | 2/2013 | ........... H01L 21/304 |
| JP | 2017-050575 A | | 3/2017 | |
| TW | 201308486 A1 | | 2/2013 | |

OTHER PUBLICATIONS

K. Kasraian and P.P. Deluca, Pharmaceutical Research, vol. 12, pp. 484-490. (Year: 1995).*

K. Araki and J.W. Halloran, "Room-Temperature Freeze Casting for Ceramics with Nanaqueous Sublimable Vehicles in the Naphthalene-Camphor Eutectic System", J. Am. Ceram. Soc, vol. 87, pp. 2014-2019. (Year: 2004).*

Buriak "Organometallic Chemistry on Silicon and Germanium Surfaces", Chemical Reviews, vol. 102, No. 5, Mar. 8, 2002, pp. 1271-1308.

Chn, et al "Non-Stiction Performance of Various Post Wet-Clean Drying Schemes on High-Aspect-Ratio Device Structures", The Electrochemical Society, vol. 58, Issue 6, 2013, 1 pp.

International Search Report and Written Opinion from related international application No. PCT/US2018/065120, dated Apr. 26, 2019, 12 pp.

Office Action from related Taiwan patent application No. 107145867, dated Sep. 12, 2019, 13 pages.

\* cited by examiner

US 10,957,530 B2

FREEZING A SACRIFICIAL MATERIAL IN FORMING A SEMICONDUCTOR

TECHNICAL FIELD

The present disclosure relates generally to semiconductor processing, and, more particularly, to freezing a sacrificial material in forming a semiconductor.

BACKGROUND

Semiconductor processing (e.g., fabrication) can be used to form semiconductor devices, such as integrated circuits, memory devices, microelectromechanical devices (MEMS), etc.

Examples of memory devices that can be formed by semiconductor processing include, but are not limited to, volatile memory (e.g., that can require power to maintain its data), such as random-access memory (RAM), dynamic random access memory (DRAM), synchronous dynamic random access memory (SDRAM), among others, and non-volatile memory (e.g., that can provide persistent data by retaining stored data when not powered), such as NAND flash memory, NOR flash memory, read only memory (ROM), electrically erasable programmable ROM (EEPROM), erasable programmable ROM (EPROM), among others.

Semiconductor processing can involve forming features (e.g., patterns) on and/or in a semiconductor (e.g., of silicon) that may be referred to as a wafer or substrate. In some examples, one or more materials, such as silicon-based materials (e.g., silicon oxide (SiO), silicon nitride (SiN), tetraethyl orthosilicate (TEOS), and/or polysilicon) may be formed on the semiconductor. For instance, a deposition process, such as physical vapor deposition (PVD), chemical vapor deposition (CVD), atomic layer deposition (ALD), electrochemical deposition and/or molecular beam epitaxy, among others may be used to form one or more materials on the semiconductor.

Subsequently, portions of the one or more materials, and in some instances, portions of the semiconductor, may be removed, such as by wet and/or dry etching, to form the features. In some examples, the features may have high aspect ratios (e.g., ratio of height to width or diameter) and may be referred to as high-aspect-ratio (HAR) features. For example, the features might be separated from each other by HAR openings.

During processing, the semiconductor and the features may be subjected to wet processing, such as wet cleaning, and subsequent drying. For example, wet cleaning can be helpful to remove residue left behind, such as by the removal process or other processing.

DETAILED DESCRIPTION

The present disclosure includes processing methods associated with forming semiconductor devices, such as integrated circuits, memory devices MEMS, among others. An example of forming semiconductor devices can include solidifying, via freezing, a sacrificial material in an opening of a structure, wherein the sacrificial material has a freezing point below a boiling point of a solvent used in a wet clean operation and removing the sacrificial material via sublimation by exposing the sacrificial material to a particular temperature and pressure range.

Embodiments of the present disclosure provide technical advantages, such as reducing the likelihood of feature collapse (e.g. toppling) during processing compared to previous approaches. For instance, a number of embodiments form a sacrificial material in openings between features in a structure, such as a structure to be used in a semiconductor device (e.g., a memory device), that acts to prevent feature collapse (e.g., sometimes referred to as pattern collapse) while the structure is drying at the end of a wet clean operation or while the structure is being moved from one processing tool to another processing tool during processing (e.g., formation of the semiconductor device).

Some prior approaches can include forming features in a structure at a dry etch tool, such as by dry etching, and moving the structure to a wet cleaning tool (e.g., to clean residue from the dry etch from the structure). After cleaning, solvent from the wet cleaning tool may remain on the structure.

Figure 1:
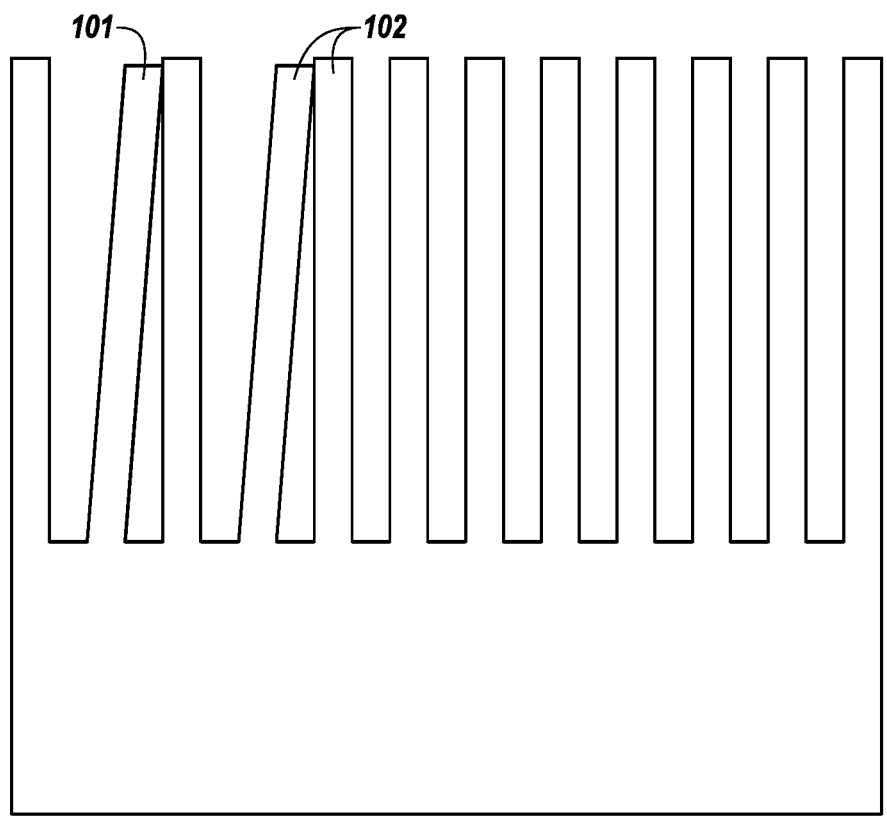
FIG. 1 presents various examples of feature toppling.

For instance, liquid solvent can remain on surfaces of a structure. Remaining liquid solvent can be a problem for structures having high aspect ratio structures, such as shallow trench isolation (STI) structures. For example, the liquid solvent may form in the openings between the features. High surface tension forces may result from the liquid in the openings that can cause the features to topple (e.g., collapse) toward each other, bringing adjacent features into contact with each other. For example, FIG. 1 illustrates a feature 101 toppling (e.g., collapsing) into an adjacent feature and a pair of adjacent features 102 toppling into each other (e.g. in what is sometimes referred to as bridging). This can lead to defects in the semiconductor device structure, and can even render the semiconductor device inoperable.

The sacrificial materials of the embodiments described herein obstruct the openings to prevent liquid solvent from remaining on the high aspect ratio structures and in the openings after a wet clean operation, and thus can reduce the likelihood of (e.g., eliminate) high aspect ratio features collapsing due to capillary forces created by the liquid solvent. The sacrificial material can completely or partially fill the openings to prevent liquid solvent from remaining in the openings while the structures are drying. The sacrificial material can be a eutectic mixture, a hypereutectic composition, and/or a hypoeutectic composition to form a sacrificial material that is a solid at room temperature, has a high vapor pressure for sublimation, and has a freezing point below the boiling point of the solvent.

In the following detailed description, reference is made to the accompanying drawings that form a part hereof, and in which is shown, by way of illustration, specific examples. In the drawings, like numerals describe substantially similar components throughout the several views. Other examples may be utilized and structural and electrical changes may be made without departing from the scope of the present disclosure. The following detailed description is, therefore, not to be taken in a limiting sense, and the scope of the present disclosure is defined only by the appended claims and equivalents thereof.

The term semiconductor can refer to, for example, a bulk material, a semiconductive wafer, or a substrate, and includes any base semiconductor structure. "Semiconductor" or "Semiconductive" is to be understood as including silicon-on-sapphire (SOS) technology, silicon-on-insulator (SOI) technology, thin-film-transistor (TFT) technology, doped and undoped semiconductors, epitaxial layers of a silicon supported by a base semiconductor structure, as well as other semiconductor structures. Furthermore, when reference is made to a semiconductor in the following description, previous process steps may have been utilized to form regions/junctions in the base semiconductor structure, and the term semiconductor can include the underlying layers containing such regions/junctions. The apparatus can be formed by semiconductor processing, but are not limited to semiconductor or semiconductive structures. For example, the apparatus can be formed using quartz substrate and/or other materials.

The figures herein follow a numbering convention in which the first digit or digits correspond to the drawing figure number and the remaining digits identify an element or component in the drawing. Similar elements or components between different figures may be identified by the use of similar digits. For example, 211 may reference element "11" in FIG. 2A, and a similar element may be referenced as 311 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIGS. 2A-2D illustrate cross-sectional views of processing steps associated with forming a semiconductor device, such as a portion of an integrated circuit, a memory device, a MEMS, among others, in accordance with a number of embodiments of the present disclosure. For example, the processing steps may be associated with forming (e.g., a memory array of) a DRAM memory device, a NAND flash memory device, a NOR flash memory device, among others.

Figure 2A:
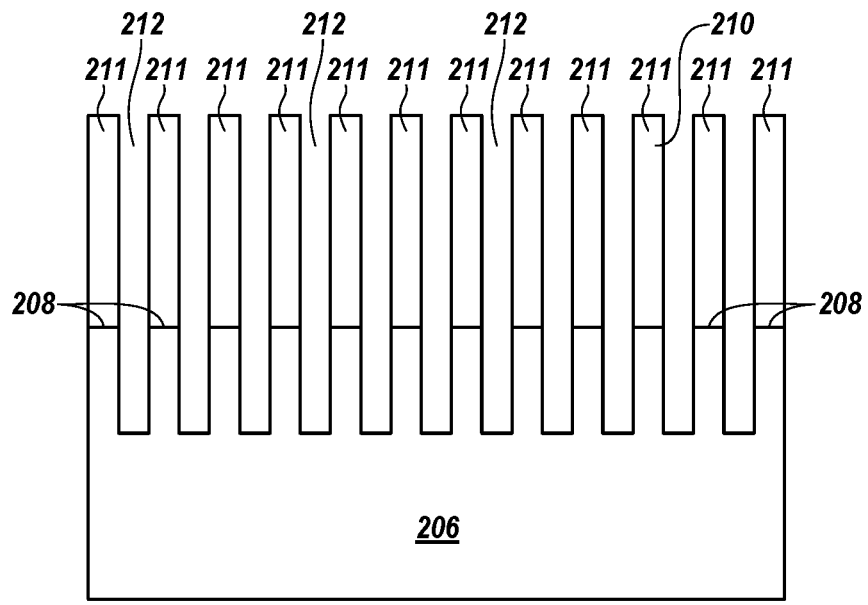
FIGS. 2A-2D illustrate cross-sectional views of processing steps associated with forming a semiconductor device, in accordance with a number of embodiments of the present disclosure.

FIG. 2A depicts a structure (e.g., to be used in a semiconductor device) after several processing steps have occurred. The structure may include a base structure, such as a substrate 206 (e.g., a semiconductor). In some examples, one or more materials 210, such as silicon-based or non-silicon based materials, may be formed on (e.g., over) a surface 208, such as an upper surface, of semiconductor 206, using, for example, a deposition process, such as PVD, CVD, ALD, electrochemical deposition and/or molecular beam epitaxy, among others.

Features 211, such as microfeatures (e.g., having a width or diameter of about 0.1 micrometer to about 100 micrometer) and/or nanofeatures (e.g., having a width or diameter of about 0.1 nanometer to about 100 nanometer) are formed by removing portions of the structure, such as portions of the one or more materials 210 and portions of semiconductor 206. The removal process forms openings 212, such as spaces (e.g., trenches), through the one or more materials 210, stopping on or in (e.g., as shown in FIG. 2A) semiconductor 206. For example, an opening 212 may be between adjacent features 211. In some examples, each of the respective features 211 includes the one or more materials 210 and a portion of semiconductor 206. In some instances, the removal process can stop above or on the surface of substrate 206.

In some examples, portions of the openings 212 in semiconductor 206 (e.g., below surface 208) may correspond to isolation regions, such as shallow trench isolation (STI) regions and/or high aspect ratio features such as those used while forming capacitors, transistors, and other electrical components. In an example, a feature 211 may be entirely of semiconductor 206, and openings 212 may correspond to STI regions. Features 211 may be HAR features, and openings 212 may be HAR openings. For example, an HAR may have a height to width or diameter ratio of 10 to 1, 25 to 1, or greater.

In some examples, openings 212, and thus the structure in FIG. 2A, may be formed using a dry processing tool (not shown), such as the dry removal tool (e.g., dry etch tool), using a dry removal process, such as a dry etch. A mask (not shown), such as imaging resist (e.g., photo-resist), may be formed over the one or more materials 210 and patterned to expose regions of the one or more materials 210. The exposed regions may be subsequently removed, such as by the dry etch process, to form openings 212 that may terminate on or in semiconductor 206.

In some examples, material, such as a dielectric material (e.g., silicon oxide, silicon nitride, etc.), an organic compound (e.g., an organic polymer), an ionic compound (e.g., an ammonium salt or a halide salt), a soluble material (e.g., soluble in a solvent, such as water, hydrofluoric acid (HF), etc.), among others, can be formed on the structure of FIG. 2A to obstruct openings 212. The material may be formed on the structure of FIG. 2A at a dry removal tool before the structure is exposed to a moisture-containing atmosphere, such as air, for example.

A wet cleaning tool may be dedicated to the removal of the particles and/or residues that may form as a result of the dry etch and/or to remove other material deposited (e.g., sacrificial material and/or mask material) on the wafer. In some examples, the composition of the material used to fill openings may be selected so it can be removed by the wet clean chemistry to be used for wet cleaning.

Material from the dry-etch process, can be removed from the structure via the wet cleaning tool (e.g., as part of the wet cleaning operation) to re-expose (e.g., reopen) the openings 212 between features 211. In an example, the wet cleaning operation may be performed in an inert atmosphere so that the structure of FIG. 2A is not exposed to a reactive gas (e.g., $O_2$).

In some examples the wet cleaning may include an aqueous wet clean that may include hydrofluoric acid (HF). In an example, an aqueous wet clean may include a standard clean-1 (SC-1) (e.g. for removing organics, particles, and films) that may include deionized (DI) water, aqueous ammonium hydroxide, and aqueous hydrogen peroxide. In some instances, a standard clean 2 (SC-2) (e.g., for removing metal ions) that may include deionized (DI) water, aqueous hydrochloric acid, and aqueous hydrogen peroxide may be performed after SC-1 as part of the aqueous wet clean. The wet-cleaning process may further include the aqueous wet clean with a DI water rinse, followed by an isopropyl (IPA) rinse, followed by drying, such as spin drying. In other examples, the wet cleaning operation and the removal of the material may be integrated, and the wet cleaning operation may remove residue from the dry etch.

Figure 2B:
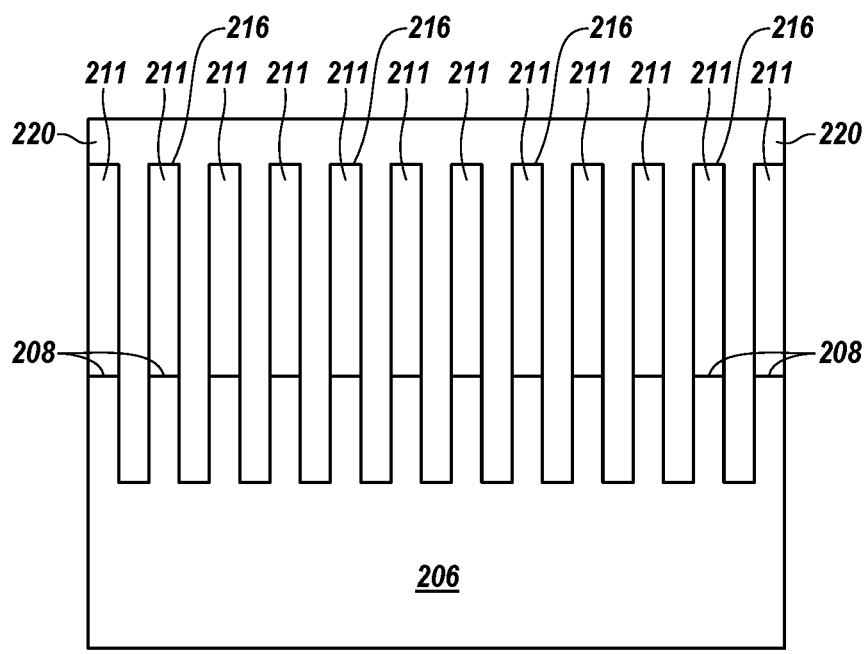

Subsequently, as shown in FIG. 2B, a sacrificial material 220, such as a volatile solid material, is formed on (e.g., is used to coat) the structure of FIG. 2A at the wet cleaning tool, to obstruct openings 212 (e.g., without exposing the structure to a gas). For example, sacrificial material 220 may be spin coated onto the structure of FIG. 2A. In some examples, sacrificial material 220 obstructs openings 212 by completely filling openings 212. In some examples, sacrificial material 220 can completely fill openings 212 such that an upper surface of sacrificial material 220 may be coplanar (e.g., flush) with the upper surfaces 216 of features 211. Additionally, as shown in FIG. 2B, sacrificial material 220 can overfill openings 212 and extend over (e.g., cover) upper surfaces 216 of features 211. In some examples, sacrificial material 220 may partially fill openings 212 such that the upper surface of sacrificial material 220 may be below the level of upper surface 216. In some examples, sacrificial material 220 may completely displace any liquid from the wet cleaning operation.

In some examples, the volatile solid may be melted to create a liquid. The liquid can then be deposited on the structure of FIG. 2A and into the openings 212 in FIG. 2A and solidified to form the structure of FIG. 2B. The liquid can be solidified via freezing, for example.

Subsequently, the structure of FIG. 2B can be moved from the wet cleaning tool to a different processing tool, such as the deposition tool. For example, the structure of FIG. 2B may be exposed to a moisture-containing atmosphere as it is moved from the wet cleaning tool to the deposition tool. However, by closing openings 212 and covering features 211, sacrificial material 220 prevents condensation on the features 211 and in openings 212, and thus the toppling of features 211 resulting from the condensation and/or physical forces. Sacrificial material 220 may also protect features 211 from oxidation that can occur as the structure is being moved through an oxygen containing atmosphere.

Figure 2C:
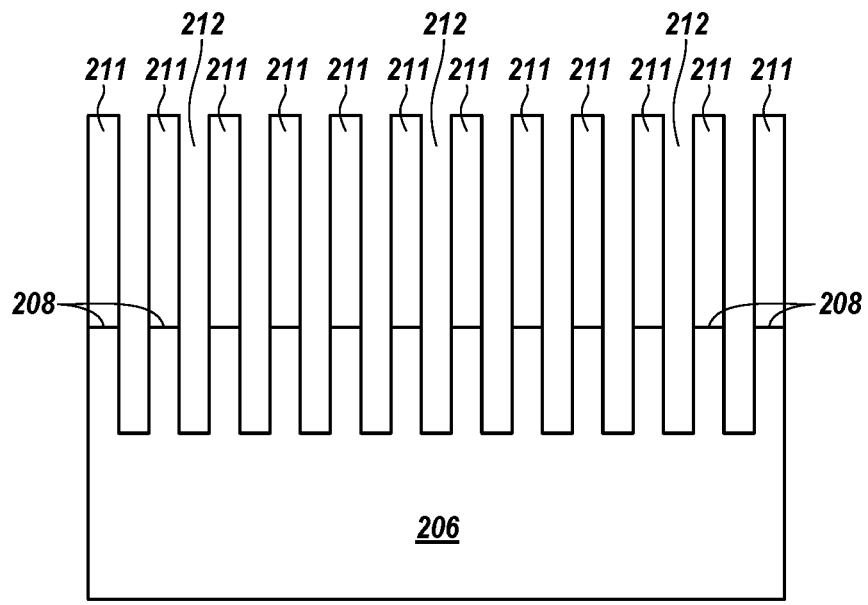
Figure 2D:
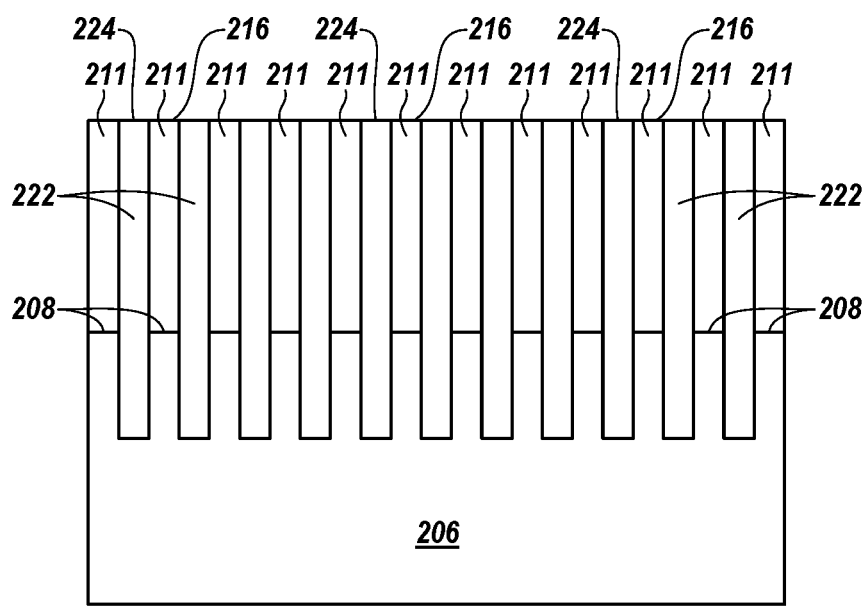
Figure 4:
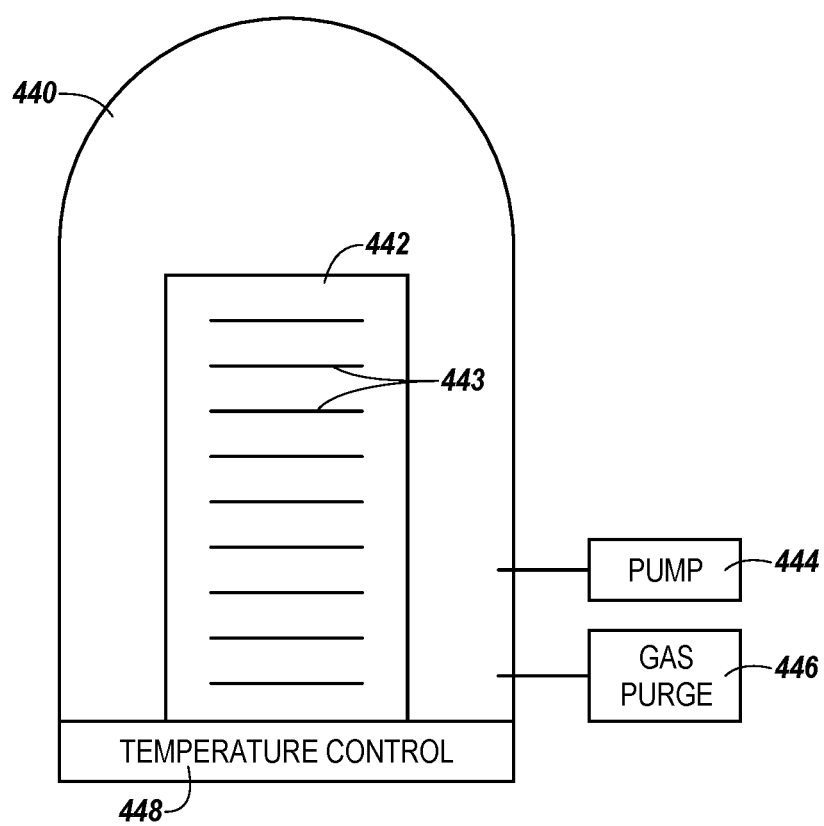
FIG. 4 is a block diagram illustration of a processing apparatus used in conjunction with the processing steps associated with forming a semiconductor device, in accordance with a number of embodiments of the present disclosure.

As shown in FIG. 2C, sacrificial material 220 may be removed at the wet cleaning tool and/or deposition tool to re-expose openings 212 between features 211. For examples in which sacrificial material 220 is a volatile material, sacrificial material 220 may be removed by sublimation. For instance, the pressure, temperature, and/or gas in a chamber, such as chamber 440 as shown in FIG. 4, may be set such that sacrificial material 220 sublimates. For example, the pressure may be controlled by a pump 444 as shown in FIG. 4, temperature may be controlled by a temperature control 443, and gas inside chamber may be controlled by a gas purge 446 as shown in FIG. 4. In other examples, the volatile sacrificial material 220 may be removed by removing the structure from the chamber. The sacrificial material 220 can be a eutectic mixture, a hypereutectic composition, and/or a hypoeutectic composition to form a sacrificial material 220 that is a solid at room temperature, has a high vapor pressure for sublimation, and has a freezing point below the boiling point of the solvent.

Figure 3:
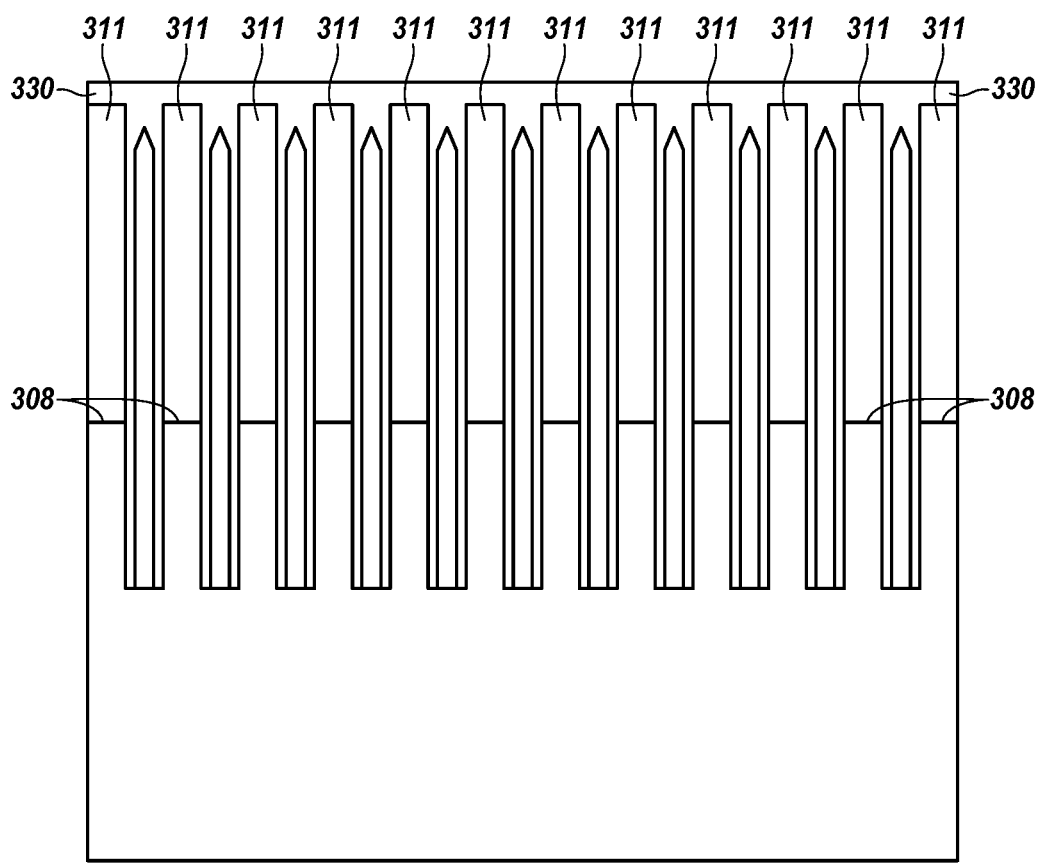
FIG. 3 an example of a processing step associated with forming a semiconductor device, in accordance with a number of embodiments of the present disclosure.

In some examples, openings 212 in the structure of FIG. 2A may be obstructed without completely filling openings 212 with a sacrificial material, such as sacrificial material 220 in FIG. 2B. As shown in FIG. 3, a sacrificial material 330 may be formed on a structure, such as the structure of FIG. 2A, to form the structure in FIG. 3. Sacrificial material 330 is formed in openings 312 and between features 311 so that sacrificial material 330 obstructs the openings 312 adjacent to a top of the openings 312 without completely filling the openings 312. Sacrificial material 330 pinches off adjacent to the top of the openings before the openings are completely filled, leaving voids 332 between features 311. For example, sacrificial material 330 lines openings 312 and obstructs openings 312 adjacent to the tops of openings 312 to create voids 332. For instance, the sacrificial material 330 is coupled between adjacent features 311 by spanning upper portions of the openings between the adjacent features 311.

In some examples, sacrificial material 330 may be sacrificial material 220, such as a volatile material, and the structure of FIG. 3 may be formed at the wet cleaning tool, which can include chamber 440. For example, in the case of sacrificial material 330 being a volatile material, the sacrificial solid 330 may be removed by sublimation to form the structure of FIG. 2C, as described previously. In some examples, the structure of FIG. 3 may be formed by applying the volatile solid as a liquefied solid and allowing the liquefied solid to solidify.

In other examples, sacrificial material 330 may be deposited to partially fill openings 312 such that sacrificial material 330 is formed on features 311 within openings 312, as shown in FIG. 3, thus lining openings 312, but without pinching off.

FIG. 4 is a block diagram illustration of a processing apparatus used in conjunction with the processing steps associated with forming a semiconductor device, in accordance with a number of embodiments of the present disclosure. The processing apparatus can include a chamber 440 to form sacrificial material in openings of structures, a carrier 442 can hold a batch of semiconductor wafers 443, and tools, for example a pump 444, a gas purge 446, and a temperature control 448, can remove sacrificial material via sublimation.

In some examples, a sacrificial material can be formed in an opening of a structure in the chamber 440. The sacrificial material can obstruct the opening 212 in FIG. 2A or 2C, in the structure. The structure can be included on one of the semiconductor wafers 443. The structure can include a plurality of features. The sacrificial material in a solid state can prevent pattern collapse caused by capillary forces after wet clean operations.

In some examples, the sacrificial material can be formed in the opening of the structure in response to performing a wet clean operation. The wet clean operation can be performed in chamber 440 and/or the same apparatus as the chamber 440 is in. The wet clean operation can include using a solvent to wet clean the structure prior to forming the sacrificial material. The solvent can evaporate prior to removing the sacrificial material. The solvent can evaporate in a carbon dioxide ($CO_2$) atmosphere, for example. In some examples, the sacrificial material in liquid state can displace a solvent of the wet clean operation. The sacrificial material can be spin coated into the opening 212 in FIG. 2A or 2C, in the structure.

In some examples, the sacrificial material can be solidified in the opening of the structure via freezing. Solidifying the sacrificial material can obstruct the opening of the structure. Solidifying can include cooling the sacrificial material below its freezing point. The sacrificial material can be cooled by reducing the temperature of the chamber 440 via a temperature control mechanism 448 of the chamber 440.

In some examples, the freezing point of the sacrificial material can be above room temperature to allow the sacrificial material to be applied hot and then freeze at room temperature. The freezing point of the sacrificial material above room temperature prevents the need to cool the structure and allows the sacrificial material to remain in the opening of the structure at room temperature without melting until sublimation. The freezing point of the sacrificial material can be above a temperature at which sublimation occurs to prevent sublimation from occurring while the structure is drying. The freezing point of the sacrificial material can be below a boiling point of the solvent to prevent the solvent from boiling when the sacrificial material is provided. Vapor bubbles can be created and result in collapse caused by capillary forces when a solvent boils. For example, the freezing point of the sacrificial material can be below 82 degrees Celsius, the boiling point of isopropyl alcohol (IPA). In some examples, the freezing point of the sacrificial material can be between 30 and 60 degrees Celsius, which is a region above room temperature and below the boiling point of a solvent.

In some examples, the sacrificial material can be a eutectic mixture, a hypereutectic composition, and/or a hypoeutectic composition to form a sacrificial material that is a solid at room temperature, has a high vapor pressure for sublimation, and has a freezing point below the boiling point of the solvent. For example, the sacrificial material can be a camphor and naphthalene mixture.

The sacrificial material can be removed in the chamber 440. The sacrificial material can be removed via sublimation by increasing the temperature of the chamber 440 via the temperature control mechanism 448 of the chamber 440. Heating the structure can cause the sacrificial material to thermally decompose into a gaseous product without melting. The structure can be heated using a temperature control 448, for example a hot plate. The chamber 440 and/or temperature control 448 can include a gas purge 446 or a pump 444, for example a vacuum, to remove the gaseous byproducts. The gas purge 446 and pump 444 can be provided to protect the structure from oxidation by removing the gaseous byproducts.

In some examples, the sacrificial material can be removed via sublimation by exposing the sacrificial material to sub-atmospheric pressure. The sacrificial material can be exposed to sub-atmospheric pressure via a pump 444 pressurizing the chamber 440. The pump 444 can be a vacuum connected or separate from the chamber 440, for example. In some examples, sublimation can be accelerated by heating the structure. The structure can be heated by a temperature control 448, for example.

In some examples, the sacrificial material can be removed via sublimation by removing a reactive gas from the structure. The sacrificial material can decompose into a gas mixture in response to removing the reactive gas from the structure. The reactive gas can be removed via the gas purge 446, for example.

Figure 5:
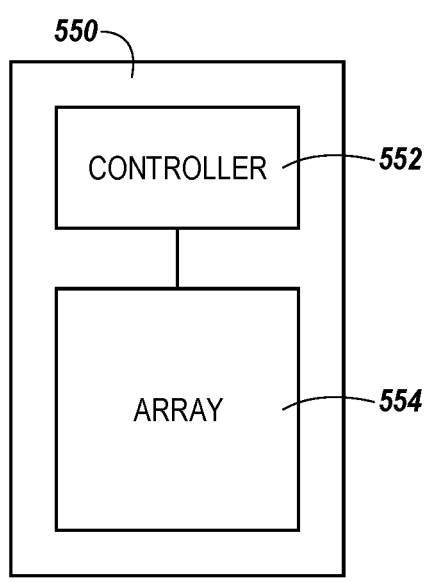
FIG. 5 is a block diagram illustration of an apparatus formed, at least in part, in accordance with a number of embodiments of the present disclosure.

FIG. 5 is a block diagram of an apparatus, such as a memory device 550. For example, memory device 550 may be a volatile memory device, such as a DRAM, a non-volatile memory device, such as NAND flash or NOR flash, among others. For example, memory device 550 may be formed, at least in part, using the processing previously described, such as in conjunction with FIGS. 2A-2D and FIG. 3.

Memory device 550 includes a controller 552, such as an application specific integrated circuit (ASIC), coupled to a memory array 554, such as a DRAM array, a NAND array, a NOR array, among others. For example, memory array 454 might be formed, at least in part, according to the processing described previously.

The controller 552 can control the operations on the memory device 550, and of the memory array 554, including data sensing (e.g., reading) and data programming (e.g., writing), for example. Memory device 550 may be coupled to a host device (not shown in FIG. 5).

Embodiments of the disclosure use sacrificial materials to obstruct openings in structures (e.g., to be used in semiconductor devices, such as integrated circuits, memory devices, MEMS, and the like), such as between features in the structures. The sacrificial materials prevent condensate from forming in the openings as the structures are moved through a moist atmosphere between tools, thereby preventing the features from collapsing.

Although specific examples have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

What is claimed is:

1. A method for forming a semiconductor device, comprising:
    displacing a solvent used in a wet clean operation in an opening of a structure with a sacrificial material at a wet cleaning tool, wherein the sacrificial material is applied above room temperature, and wherein the sacrificial material has a freezing point below a boiling point of the solvent;
    solidifying, via freezing, the sacrificial material in the opening of the structure at the wet cleaning tool, wherein the sacrificial material includes naphthalene and the freezing point of the sacrificial material is between 30 and 60 degrees Celsius;
    exposing the structure with the sacrificial material to oxygen after solidifying the sacrificial material and prior to removing the sacrificial material via sublimation in response to moving the structure from the wet cleaning tool to a deposition tool; and
    removing the sacrificial material via sublimation by exposing the sacrificial material to a particular temperature range at the deposition tool.

2. The method of claim 1, wherein solidifying the sacrificial material obstructs the opening of the structure.

3. The method of claim 1, wherein solidifying the sacrificial material includes cooling the sacrificial material below its freezing point.

4. The method of claim 1, wherein the sacrificial material is a camphor and naphthalene mixture.

5. The method of claim 1, wherein solidifying the sacrificial material prevents pattern collapse while the structure dries.

6. A method for forming a semiconductor device, comprising:
    forming a plurality of features in a structure at a dry etch tool;
    performing a wet clean operation on the structure using a solvent at a wet cleaning tool;
    displacing the solvent with a sacrificial material at the wet cleaning tool, wherein the sacrificial material is applied above room temperature, and wherein the sacrificial material has a freezing point below a boiling point of the solvent;
    solidifying, via freezing, the sacrificial material in openings of the plurality of features at the wet cleaning tool, wherein the sacrificial material includes camphor and the freezing point of the sacrificial material is between 30 and 60 degrees Celsius;

exposing the structure with the sacrificial material to oxygen after solidifying the sacrificial material and prior to removing the sacrificial material via sublimation in response to moving the structure from the wet cleaning tool to a deposition tool; and removing the sacrificial material via sublimation by exposing the sacrificial material to a particular temperature range at the deposition tool.

7. The method of claim 6, wherein the sacrificial material is a eutectic mixture.

8. A method for forming a semiconductor device, comprising:

forming a plurality of features in a structure at a dry etch tool;

performing a wet clean operation on the structure using a solvent at a wet cleaning tool;

displacing the solvent with a sacrificial material at the wet cleaning tool, wherein the sacrificial material is applied above room temperature, and wherein the sacrificial material has a freezing point below a boiling point of the solvent;

solidifying, via freezing, the sacrificial material in an opening of the plurality of features at the wet cleaning tool, wherein the sacrificial material is a camphor and naphthalene mixture and the freezing point of the sacrificial material is between 30 and 60 degrees Celsius;

exposing the structure with the sacrificial material to oxygen after solidifying the sacrificial material and prior to removing the sacrificial material via sublimation in response to moving the structure from the wet cleaning tool to a deposition tool; and removing the sacrificial material via sublimation by exposing the sacrificial material to a particular temperature range at the deposition tool.

9. The method of claim 8, wherein the freezing point of the sacrificial material is above a temperature at which sublimation occurs.

10. The method of claim 8, wherein the freezing point of the sacrificial material is below the boiling point of the solvent to prevent the solvent from boiling.

11. The method of claim 8, wherein vapor bubbles form when the solvent boils.

12. The method of claim 11, wherein the vapor bubbles cause pattern collapse.

13. The method of claim 8, wherein the solvent is isopropyl alcohol (IPA).

* * * * *